US008164336B1

United States Patent
Murphree, Jr. et al.

(10) Patent No.: US 8,164,336 B1
(45) Date of Patent: Apr. 24, 2012

(54) TRANSMISSION LINE PROBE FOR NMR

(76) Inventors: Dennis Haaga Murphree, Jr., New Haven, CT (US); David Paul DeMille, Clinton, CT (US); Sidney Bernard Cahn, New Haven, CT (US)

( * ) Notice: Subject to any disclaimer, the term of this patent is extended or adjusted under 35 U.S.C. 154(b) by 1200 days.

(21) Appl. No.: 11/983,506

(22) Filed: Nov. 10, 2007

(51) Int. Cl.
*G01V 3/00* (2006.01)
(52) U.S. Cl. .................. 324/318; 324/322; 324/330
(58) Field of Classification Search .............. 324/318
See application file for complete search history.

(56) References Cited

U.S. PATENT DOCUMENTS

| | | | | |
|---|---|---|---|---|
| 4,398,149 A * | 8/1983 | Zens | ............ | 324/319 |
| 6,380,742 B1 * | 4/2002 | Stringer et al. | ............ | 324/322 |
| 6,593,743 B2 * | 7/2003 | de Swiet et al. | ............ | 324/318 |
| 7,064,549 B1 * | 6/2006 | Hudson | ............ | 324/318 |
| 7,132,829 B2 * | 11/2006 | Hudson et al. | ............ | 324/318 |
| 2005/0156597 A1 * | 7/2005 | Lim et al. | ............ | 324/322 |
| 2006/0066416 A1 * | 3/2006 | Nicholson et al. | ............ | 333/32 |
| 2006/0082372 A1 * | 4/2006 | Finnigan | ............ | 324/322 |
| 2006/0176057 A1 * | 8/2006 | Lim et al. | ............ | 324/322 |
| 2007/0164730 A1 * | 7/2007 | Pollock et al. | ............ | 324/158.1 |
| 2009/0261829 A1 * | 10/2009 | Ikeda et al. | ............ | 324/318 |
| 2010/0244835 A1 * | 9/2010 | McKinnon | ............ | 324/318 |
| 2010/0308831 A1 * | 12/2010 | Eberlein et al. | ............ | 324/318 |
| 2011/0124507 A1 * | 5/2011 | Wosik et al. | ............ | 505/162 |
| 2011/0148415 A1 * | 6/2011 | Boskamp | ............ | 324/318 |

\* cited by examiner

*Primary Examiner* — Brij Shrivastav
*Assistant Examiner* — Benjamin M Baldridge

(57) ABSTRACT

A probe for an NMR device is disclosed in which a saddle coil is disposed on one side of a flexible insulating material, and an additional conductor is disposed on the opposite side. The additional conductor and the conductors of the saddle coil create a capacitance across the insulating material. This capacitance acts with the inductance of the saddle coil such that the probe itself forms a transmission line. The probe is thus inherently broadband and requires no tuning. It also presents a constant impedance, thus facilitating impedance matching to an NMR spectrometer. In a preferred embodiment, a chip resistor is disposed on the flexible insulating material, terminating the transmission line.

8 Claims, 5 Drawing Sheets

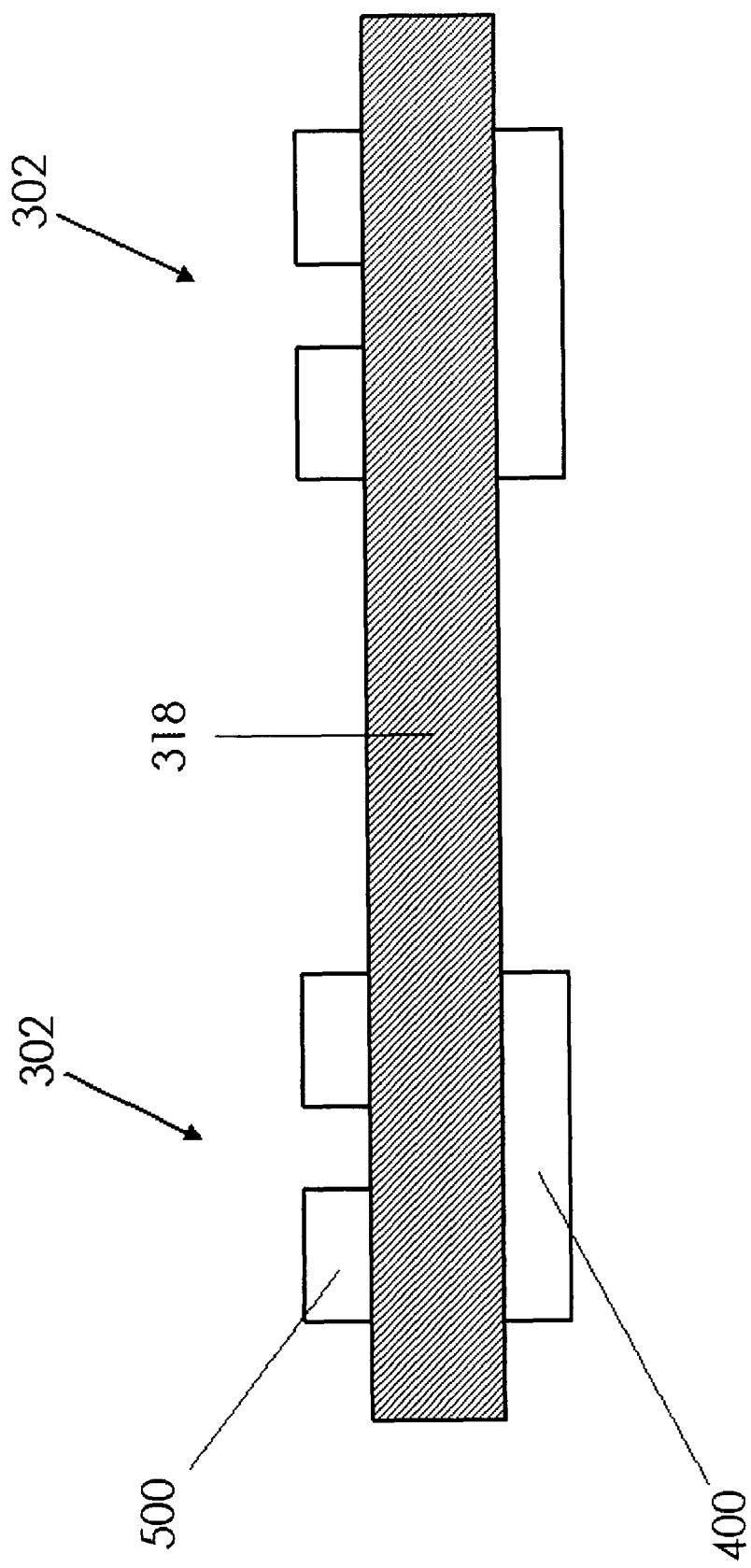

TRANSMISSION LINE PROBE FOR NMR

STATEMENT REGARDING FEDERALLY SPONSORED RESEARCH

The U.S. Government has a paid-up license in this invention and the right in limited circumstances to require the patent owner to license others on reasonable terms as provided for by the terms of PHY-0457039 awarded by the National Science Foundation.

DESCRIPTION OF ATTACHED APPENDIX

Not Applicable

BACKGROUND OF THE INVENTION

1. Field of Invention

The present invention relates generally to the field of nuclear magnetic resonance (NMR), and more specifically to an NMR probe wherein the probe itself constitutes a transmission line.

2. Prior Art

The nuclear magnetic resonance phenomenon occurs in atomic nuclei having an odd number of protons or neutrons. Due to the spin of the protons and neutrons, each such nucleus exhibits a magnetic moment, such that, when a sample composed of such nuclei is placed in a static, homogeneous magnetic field, $B_0$, a greater number of nuclear magnetic moments align with the field to produce a net macroscopic magnetization M in the direction of the field. Under the influence of the magnetic field $B_0$, the aligned magnetic moments precess about the axis of the field at a frequency which is dependent on both the strength of the applied magnetic field and on the characteristics of the nuclei. The angular precessional frequency, $\omega$, also referred to as the Larmor frequency, is given by the Larmor equation $\omega=\gamma B$, in which $\gamma$ is the gyromagnetic ratio (which is constant for each NMR isotope) and wherein B is the magnetic field ($B_0$ plus other fields) acting upon the nuclear spins. It is thus apparent that the resonant frequency is dependent on both the nuclei contained in the sample as well as the strength of the magnetic field in which the sample is placed.

The orientation of magnetization M, normally directed along the magnetic field $B_0$, may be perturbed by the application of magnetic fields oscillating at or near the Larmor frequency. Typically, such magnetic fields, designated $B_1$, are applied orthogonal to the direction of the $B_0$ field by means of RF pulses through a coil connected to radio-frequency-transmitting apparatus. Under the influence of RF excitation, magnetization M rotates about the direction of the $B_1$ field. In NMR studies, it is typically desired to apply RF pulses of sufficient magnitude and duration to rotate magnetization M into a plane perpendicular to the direction of the $B_0$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. As is evident from the Larmor equation, the frequency of these signals, and thus the frequency at which the RF coil or coils in an NMR probe must transmit and receive, is dependent on the magnetic field and the nuclear species.

Conventional NMR probes employ a resonant circuit which must be tuned near the frequency of interest. The bandwidth of frequencies to which a conventional probe is sensitive is thus limited by the Q of the resonant circuit. This limits the range of magnetic fields and/or nuclear species to which a conventional probe is sensitive without changing the frequency to which the resonant circuit is tuned. In many applications of NMR this bandwidth limitation poses substantial difficulties. It is particularly problematic in studies where it is desirable to vary the $B_0$ field over a wide range of magnitudes, in studies of quadrupolar nuclei (which contain very broad resonances), in studies of multiple nuclear species, or whenever physical access to the tuning elements of the probe is limited. It will be thus apparent that in many applications it is desirable to have an NMR probe which is not limited in bandwidth. It will be thus further apparent that the limitation in bandwidth is related to the presence of a resonant circuit.

Another important aspect of NMR probes is an impedance matching circuit. Because NMR probes transmit and receive RF signals, it is important to match the probe impedance to the impedance of the apparatus to which it is attached (usually an NMR spectrometer). In a probe based on a resonant circuit, the impedance depends on the frequency, so an additional electronic circuit called a matching circuit is required. This circuit, frequently based on tunable reactances, is adjusted until the probe impedance matches the spectrometer impedance. Because changing the resonant frequency of a tuned probe changes its impedance as well, any time the tuning of a resonant circuit probe is adjusted the matching network must be adjusted as well. This is often a time consuming process. Thus it is desirable to have an NMR probe with an impedance which does not depend on frequency. Such a probe is particularly desirable in applications such as those described above, where the frequency of interest is varied substantially.

A further characteristic important in the behavior of NMR probes is coil geometry. Two types of coil which have traditionally been used for NMR studies of an object are the simple solenoid and the saddle coil. Which coil is used will typically depend on the geometry of the structure which provides the main static magnetic field. For example, if the geometry only permits the object under study to be inserted in a direction perpendicular to the lines of flux of the main magnetic field, a solenoidal coil is most efficient. This is the case when the main magnetic field is provided by a resistive or a permanent magnet. On the other hand, when the object under study is inserted in the same direction as the lines of flux, as in a superconducting magnet with a horizontal bore, the saddle coil must be used. Both types of coil are discussed by D. Hoult and R. Richards, "The Signal-to-Noise Ratio of the Nuclear Magnetic Resonance Experiment", *Journal of Magnetic Resonance*, Volume 24 (1976), p. 71-85. An example of a saddle coil can be found in U.S. Pat. No. 4,398,149. Because it is based on a resonant circuit, it suffers all of the bandwidth limitations inherent to conventional tuned probes.

Because horizontal bore superconducting magnets favor the use of saddle coil probe geometries, it is thus apparent that in many applications it is desirable to have an NMR probe of the saddle coil geometry which is not limited in bandwidth.

Several attempts have been made to overcome the limitations in bandwidth imposed by resonant tuned circuits in NMR probes. I. J. Lowe and M. Engelsberg, "A Fast Recovery Pulse Nuclear Magnetic Resonance Sample Probe Using a Delay Line", *Review of Scientific Instruments*, Vol. 45, No. 5, May 1974, pp. 631-639, disclosed a lumped parameter delay line, a design which was modified in I. J. Lowe and D. W. Whitson, "Homogeneous RF Field Delay Line Probe for Pulsed Nuclear Magnetic Resonance", *Review of Scientific Instruments*, Vol. 48, No. 3, March 1977, pp. 268-274. These probes are delay lines, however, thus have an intrinsic cutoff frequency. In addition they are difficult to manufacture. Furthermore, they are of geometries inappropriate for superconducting magnets with horizontal bores. They also present an impedance which depends on frequency. Atsushi Kubo and Shinji Ichikawa, "Ultra-broadband NMR probe: numerical and experimental study of transmission line NMR probe", *Journal of Magnetic Resonance*, Vol. 162, Issue 2, June 2003, pp. 284-299, also use lumped elements to construct delay line probes which have intrinsic cutoff frequencies. These probes are also not of the saddle coil geometry, and in addition suffer a frequency dependent impedance. Furthermore, their electrical behavior is cyclic as a function of frequency rather than uniform.

If a probe is constructed such that the coil itself constitutes a transmission line, and that transmission line is properly terminated, then the coil will be substantially sensitive to a wide range of frequencies. This is because in a loss-free transmission line, the impedance is independent of frequency. Thus signals of all frequencies in such a line propagate with the same facility. The impedance of such a transmission line is given by $Z=\sqrt{L/C}$, where L and C are the inductance and capacitance per unit length. Transmission lines are discussed by D. M. Pozar, "Microwave Engineering", $3^{rd}$ Ed., John Wiley & Sons, 2004.

As a point of clarification, it should be noted that a probe constructed such that the probe itself constitutes a transmission line is distinct from the situation in which an NMR probe contains a transmission line. Many NMR probe designs include transmission line segments in order to move tuning and matching elements farther from the coil, or to aid in impedance matching a particular portion of the coil, or in other functions of design. However, these designs are still based on resonant circuits, thus suffer the penalties of limited bandwidth, stringent tuning, and frequency-dependent-impedance-matching requirements associated with resonant NMR probes.

OBJECTS AND ADVANTAGES

It is therefore an object of this invention to provide an NMR RF probe of the saddle coil geometry such that the probe itself constitutes a transmission line.

An advantage of this invention is that the probe will have substantially uniform performance, over a broad range of frequencies, without the need for tuning. This significantly simplifies situations where a parameter such as the static magnetic field or nucleus of interest is changed.

Another advantage of this invention is that the impedance of the NMR probe will be substantially constant across a broad range of frequencies. This greatly facilitates matching the probe impedance to that of an NMR spectrometer, particularly in cases where the probe frequency is frequently or substantially changed.

Yet another advantage of this invention is that by forming the probe in the saddle coil geometry, its use is appropriate in a wide variety of experimental situations.

Still another advantage of this invention is that it is particularly straightforward to manufacture, overcoming many of the difficulties encountered in prior art lumped element delay line probes.

Further objects and advantages of this invention will become apparent from a consideration of the drawings and ensuing description.

SUMMARY

In summary, we disclose an NMR probe which is designed such that the probe itself constitutes a transmission line. The probe consists of a saddle coil on one side of a flexible insulating material, and an additional conductor on the opposite side. The additional conductor, along with the conductors of the saddle coil, create a capacitance across the insulating material. This capacitance acts with the inductance of the saddle coil such that the probe itself forms a transmission line, similar to microstrip transmission line. The probe is thus inherently broadband and requires no tuning. It also presents a constant impedance, thus facilitating impedance matching to an NMR spectrometer. This impedance can be designed by specifying the capacitance and inductance of the probe. In a preferred embodiment, a chip resistor is disposed on the flexible insulating material, terminating the transmission line.

DRAWINGS

Figures

The drawings constitute a part of this specification and include exemplary embodiments to the invention, which may be embodied in various forms. It is to be understood that in some instances various aspects of the invention may be shown exaggerated or enlarged to facilitate an understanding of the invention.

FIG. 5 is a cross-sectional view of the present invention taken along section line 5-5 of FIGS. 3 and 4.

REFERENCE NUMERALS

| "PA" refers to prior art | |
|---|---|
| 10 | PA symmetry axis |
| 12 | PA coil winding portion |
| 14 | PA coil winding portion |
| 15a | PA coil winding portion inner terminal |
| 15b | PA coil winding portion outer terminal |
| 16 | PA coil conductive bridge |
| 17 | PA coil connecting link |
| 18 | PA coil external terminal |
| 19 | PA coil external terminal |
| 300 | winding portion |
| 302 | winding portion |
| 304 | external terminal |
| 306 | conductive via |
| 308 | conductive via |
| 310 | conductive via |
| 312 | conductive via |
| 314 | break in conductor (optional) |
| 316 | conductive via, external terminal |
| 318 | insulating material |
| 320 | conductor |
| 322 | conductor |
| 324 | connecting link (conductor) |
| 326 | connecting link (conductor) |
| 400 | additional conductor |

-continued

| | "PA" refers to prior art |
|---|---|
| 402 | connecting link (conductor) |
| 404 | connecting link (conductor) |
| 500 | conductor |

DETAILED DESCRIPTION OF THE PREFERRED EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
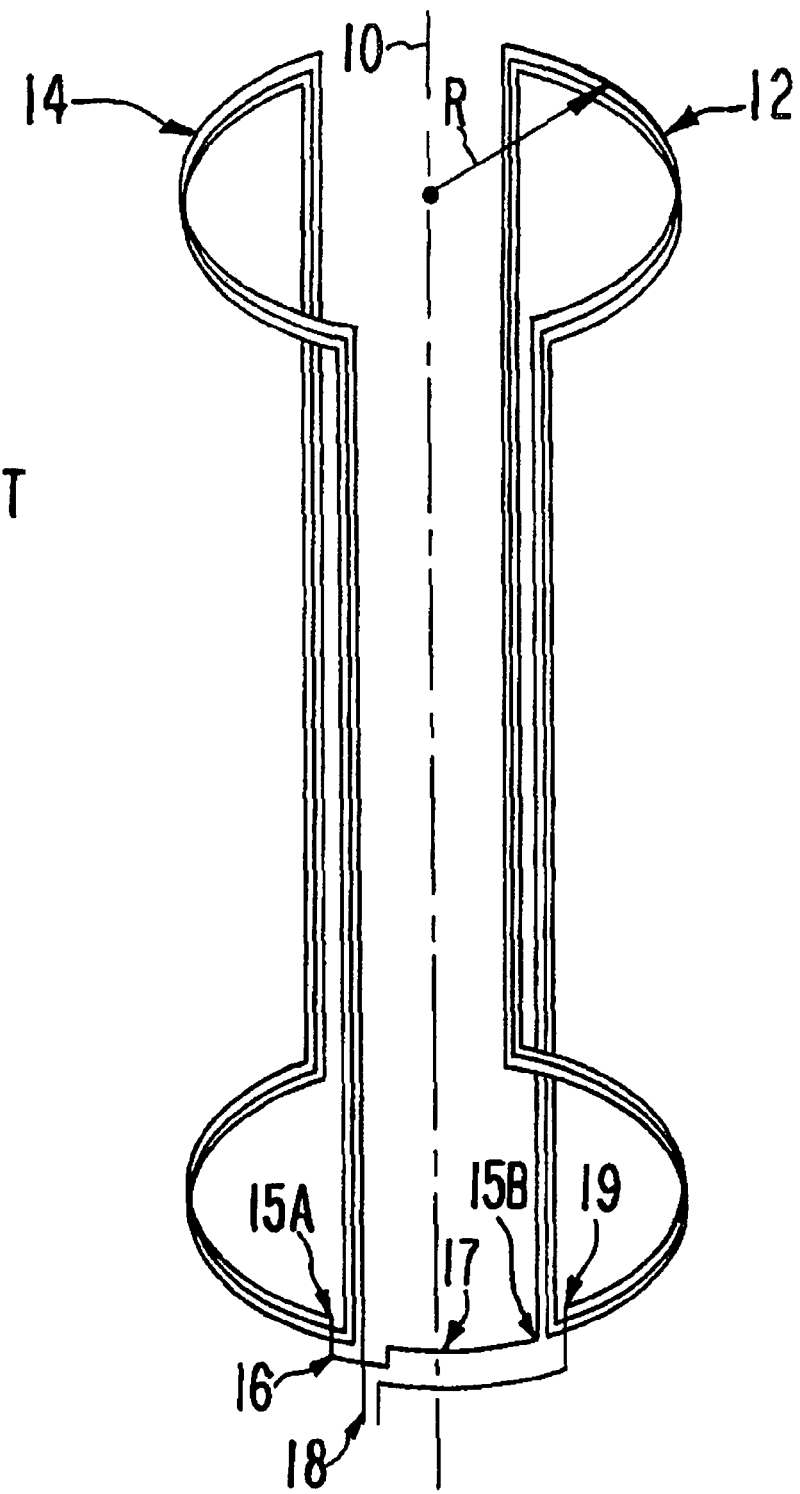
FIG. 1 is a prior art saddle coil.
Figure 2:
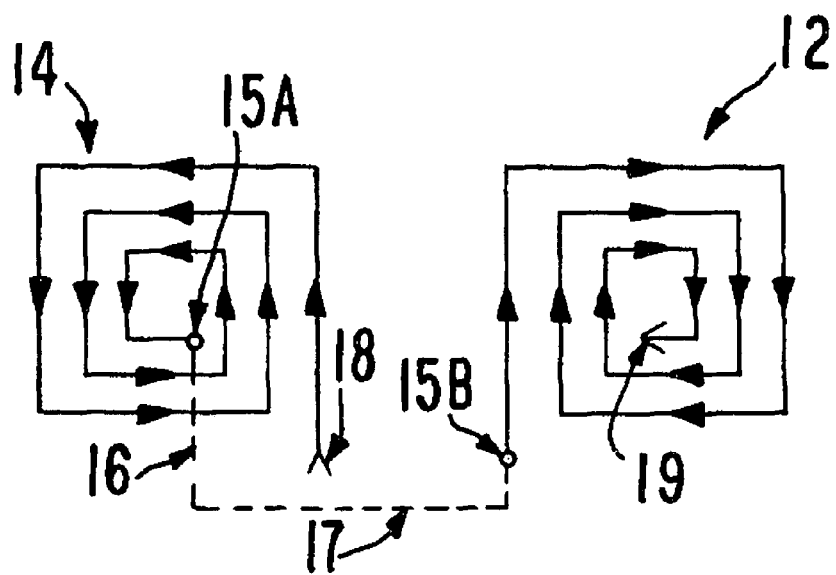
FIG. 2 is a representation of the saddle coil of FIG. 1.

A prior art saddle coil of radius R is shown in FIG. 1. Two square spiral wound coil portions 12 and 14, of opposite helicities, are symmetrically arranged about an axis 10 to define a cylindrical volume there between. The inner terminal 15a of winding portion 14 must bridge at 16 windings of portion 14 to connect through connecting link 17 to the outer terminal 15b of portion 12. Terminals 18 and 19 are the external terminals of the series combination forming the complete saddle coil. For convenience, this prior art arrangement is shown in FIG. 2 mapped on to a plane, where only a few turns are shown. The present invention concerns the addition of a separate conductor to form a novel type of NMR probe.

Figure 3:
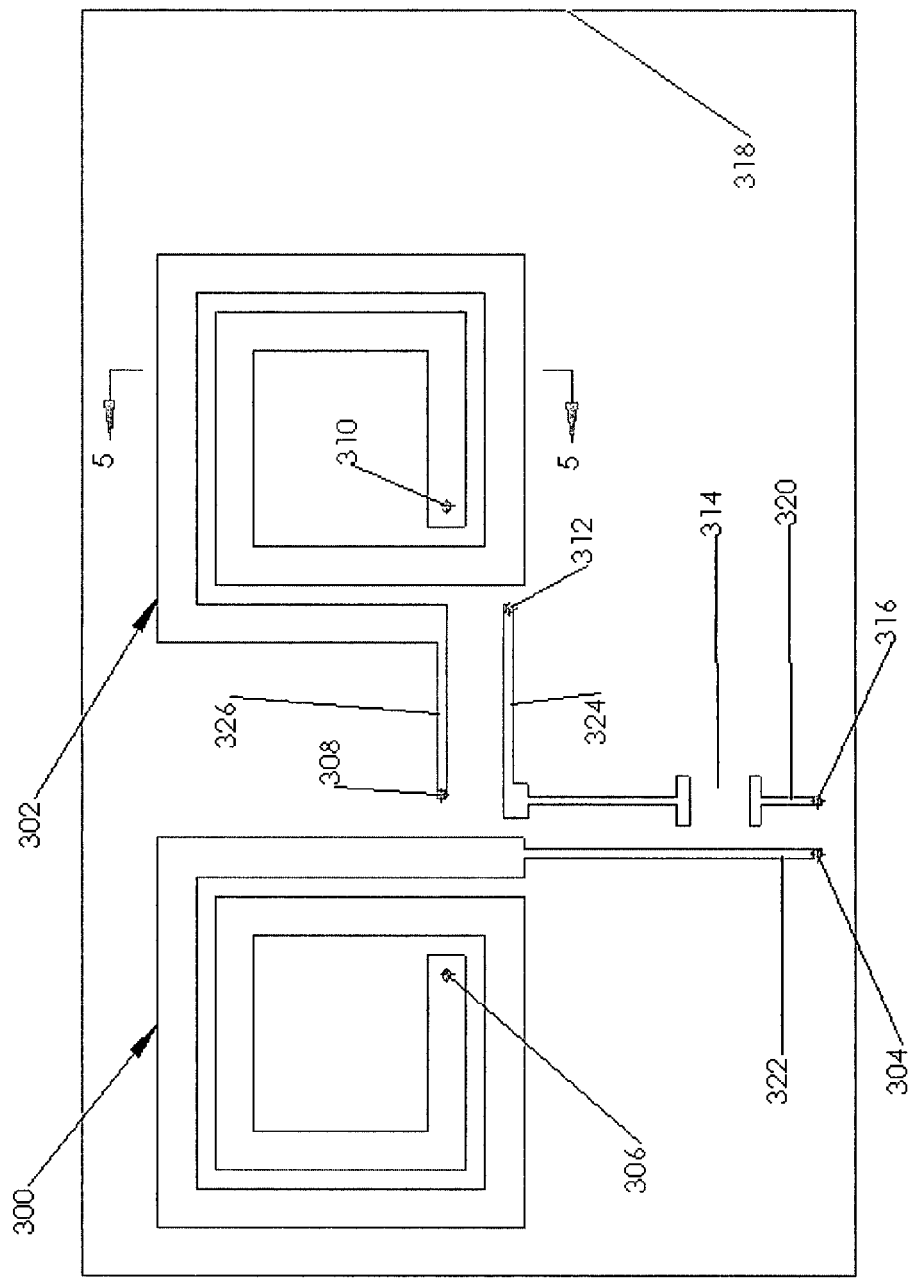
FIG. 3 is a plan view of the upper surface of the flexible insulating material of the present invention prior to deforming into cylindrical coilform.
Figure 4:
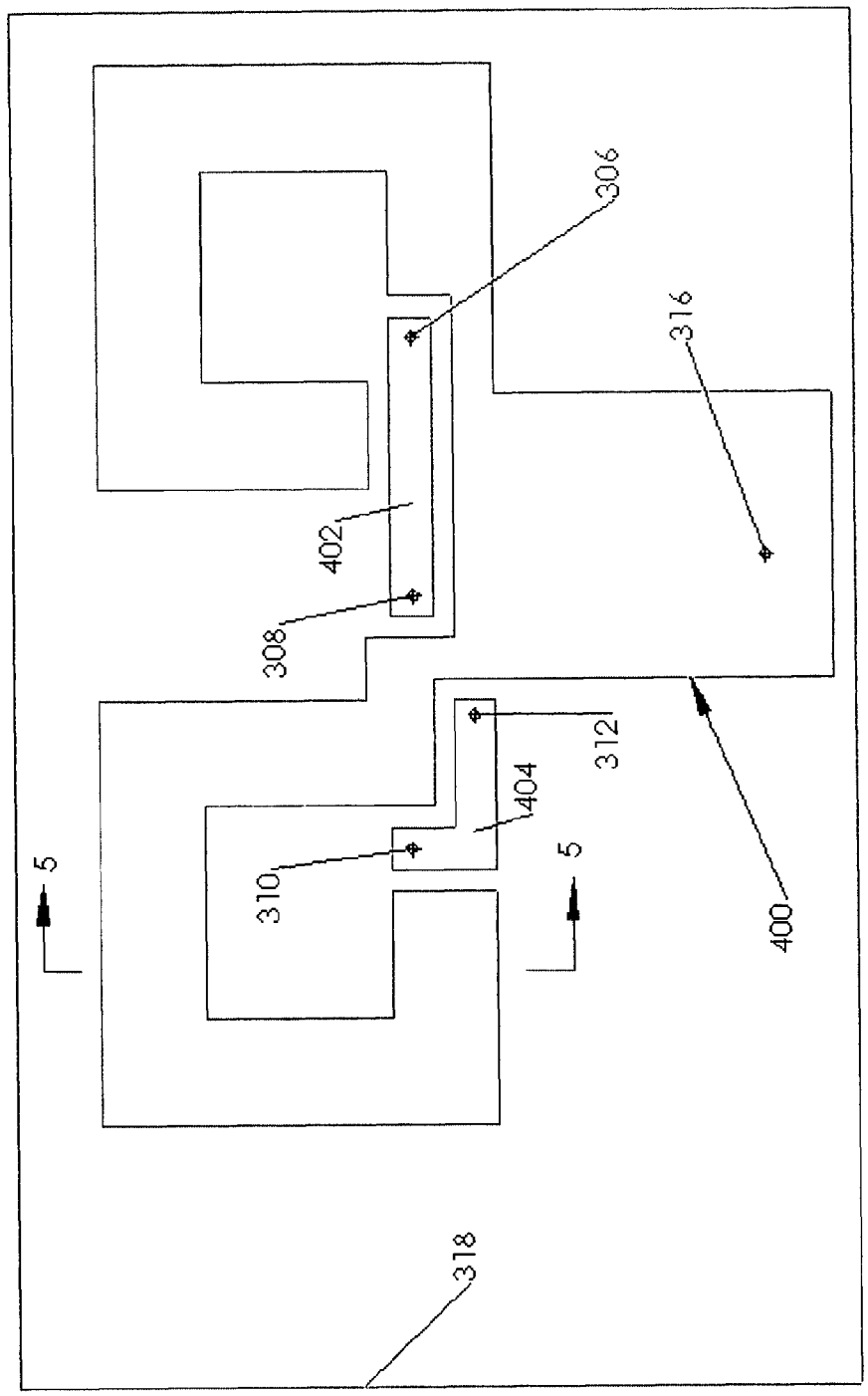
FIG. 4 is a plan view of the under surface of the flexible insulating material of the present invention prior to deforming into cylindrical coilform.

A typical embodiment of the NMR probe of the present invention is illustrated in FIG. 3 (top view) and FIG. 4 (bottom view). There are two respective winding portions 300 and 302, each containing a plurality of loops, and exhibiting opposite helicities, disposed on the upper surface of flexible insulating material 318. An additional conductor 400 is disposed on the under surface of material 318. Flexible insulating material 318 can be deformed to form a cylindrical body (coilform) similar in shape to that depicted in FIG. 1, such that winding portions 300 and 302 symmetrically oppose each other across an axis. In such a configuration the upper surface of material 318 corresponds to the inner surface of the cylindrical body, while the under surface of material 318 corresponds to the outer surface of the cylindrical body. It is additional conductor 400 which contributes fundamentally to the novel properties of this probe.

Terminals 306, 308, 310, 312, and 316 are comprised of conductive vias connecting the upper and under surfaces of insulating material 318. External connections to the probe are made through external terminals 304 and 316. External terminal 304 connects to winding portion 300 through conducting segment 322. Terminals 306 and 308 are connected through connecting link 402 disposed on the under surface of material 318. Terminal 308 is connected to winding portion 302 by connecting link 326 disposed on the upper surface of material 318. Similarly, terminals 310 and 312 are connected through connecting link 404 disposed on the under surface of material 318. Connecting link 324, disposed on the upper surface of material 318, connects terminal 312 to optional break 314, which in turn connects via conducting segment 320 to external terminal 316. Optional break 314 allows for the placement of a terminating resistor if desired. In the absence of optional break 314, connecting link 324 connects directly to conducting segment 320. Terminals 304 and 316 are the external terminals of the probe and are the only required external connections. By extending conducting segments 320 and 322, said external terminals can be located an arbitrary distance from the winding portions. Conductive via 316 comprises a connecting link for additional conductor 400 to an external terminal of the probe.

A cross-sectional view of the present invention is shown in FIG. 5. Conductor portion 500 is one section of winding portion 302. A distributed capacitance is formed between additional conductor 400 and conductor portion 500 across insulating material 318. This distributed capacitance is present throughout substantial portions of the coil. Conductor portion 500 is not special and is only singled out in order to illustrate the distributed capacitance. This capacitance acts with the inductance of the coil to form a transmission line.

In a practical realization of the probe coil of the present invention, the winding portions, additional conductor, and connecting links are printed by standard techniques on suitable flexible insulating material 318, for example a double laminate. A printed circuit realization of the invention is preferred because of the greater precision obtained for the geometrical and electrical properties of the resulting coil. These techniques are well known and outside the scope of the present invention.

Several beneficial results attend the configuration of the NMR probe of the present invention. As previously mentioned, the additional conductor 400 forms a distributed capacitance along substantial portions of the saddle coil. This combines with the inductance of the coil to form a transmission line, similar in geometry to microstrip transmission line. This would not be the case if additional conductor 400 were not present. By manufacturing the probe such that the coil itself is a transmission line, the probe is no longer a resonant circuit, thus the bandwidth of the probe is substantially increased, and the need for tuning apparatus is obviated.

A further benefit of constructing the coil such that the probe itself forms a transmission line is that the impedance of the probe will be constant across a substantial range of frequencies. If this impedance is selected to be that of an NMR spectrometer, the need for impedance matching apparatus is obviated. The impedance of an ideal transmission line is given by $Z=\sqrt{L/C}$, where L and C are the inductance and capacitance per unit length. Thus a transmission line probe's impedance can be selected by adjusting its inductance and capacitance to give the desired ratio.

In the present invention there are two sections which contribute distinctly to the impedance: the conductors in winding portions 300 and 302, and the conducting segments which are not part of the winding portions, for example 320 or 322. In a preferred embodiment these two impedances are substantially similar, giving the entire probe a substantially uniform impedance.

The impedance of conducting segments which are not part of the winding portions can be specified by using well known formulas for microstrip transmission line. These are discussed for example by D. M. Pozar, "Microwave Engineering", $3^{rd}$ Ed., John Wiley & Sons, 2004.

The impedance of the winding portions of the probe can be specified by designing the inductance and capacitance of these portions. The inductance of the winding portions of the present probe can be selected by adjusting both the size of and the number of loops in the winding portions. The capacitance of the winding portions of the present probe can be selected by specifying the width of the winding portions' conductors, and both the thickness and dielectric constant of the flexible insulating material. The appropriate values for the capacitance and inductance can be straightforwardly computed by one skilled in the art. For example, for the capacitance we have successfully used the well known formula for the capacitance of a parallel plate capacitor, while to calculate the inductance we used a simple expression for the inductance of a square spiral inductor published by S. S. Mohan, M. Hershenson, S. P. Boyd and T. H. Lee, "Simple Accurate Expressions for Planar Spiral Inductances", IEEE Journal of Solid-State Circuits, October 1999, pp. 1419-24.

For a specific construction example, consider a probe containing a saddle coil with two loops in each winding portion, where the coil forms a cylinder of radius 7.5 mm and height 15 mm. If the insulating material has a dielectric constant of 3.74, to make an impedance near 50 ohms a winding portion conductor width of 0.062" and an insulating material thickness of 0.007" are appropriate. A width of 0.014" for conducting segments which are not part of the winding portions is appropriate.

Even if the probe impedance is not selected to be that of the spectrometer, the required impedance matching apparatus will still be substantially reduced in complexity compared to a conventional matching apparatus. This is because the impedance will be constant across a substantial range of frequencies.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

CONCLUSIONS, RAMIFICATIONS, AND SCOPE

Accordingly, the reader will see that the RF probe of this invention is designed such that the probe itself constitutes a transmission line. This confers several advantages, in that
    the probe is ultra-broadband, operating with uniform performance across a wide range of frequencies
    the probe circuit is non-resonant, so external parameters such as static magnetic field strength or nucleus of interest can be changed without re-tuning
    the probe presents a constant impedance across a wide range of frequencies, thus facilitating impedance matching to a spectrometer.

Furthermore, by forming the probe in the saddle coil geometry, its use becomes appropriate in a wide variety of experimental situations. Additionally, the design of the RF probe of this invention makes it particularly easy to manufacture.

Although the description above contains many specific descriptions, these are not to be construed as limiting the scope of the invention but as merely providing illustrations of some of the presently preferred embodiments of the invention. For example, although the probe has been described for use in NMR, it could also be employed with nuclear quadrupole resonance (NQR) apparatus. Additionally, although the description has focused on a saddle coil geometry, any axially symmetric coil design could be successfully employed.

Thus the scope of the invention should be determined by the appended claims and their legal equivalents, rather than by the examples given.

What is claimed is:

1. An RF probe formed on opposite surfaces of a flexible dielectric substrate, wherein the substrate is then deformed to form a substantially cylindrical coilform, said probe comprising:
    a) a coil formed by electrically conductive metallization or other conductive material disposed on an upper surface of the flexible dielectric substrate, wherein said coil is comprised of two winding portions, and wherein said winding portions are connected by a linking conductor, and wherein each of said winding portions is comprised of a plurality of concentric loops;
    b) an additional electrically conductive layer or area disposed on a lower surface of said flexible dielectric substrate, such that a capacitance is formed across said flexible dielectric substrate, said capacitance acting in combination with the inductance of said coil to substantially form a transmission line,
    c) electrically conductive connecting means for coupling electrical signals to or from said coil and said additional conductor to an external apparatus, wherein the impedance of the RF probe across a broad frequency range of interest is substantially constant, and
    wherein the probe generates or detects radio frequency electromagnetic radiation in a transverse direction to the longitudinal axis of the cylindrical coilform.

2. The RF probe of claim 1 wherein said coil is of a saddle coil geometry.

3. The RF probe of claim 2 wherein said coil is of an axially symmetric coil geometry.

4. The RF probe of claim 1 wherein said coil is of an axially symmetric coil geometry.

5. The RF probe of claim 4 wherein said coil is of a saddle coil geometry.

6. The RF probe of claim 1 wherein said probe contains an electrically resistive means for terminating said transmission line.

7. A nuclear magnetic resonance probe assembly for a nuclear magnetic resonance apparatus, comprising:
    a) a coil formed by electrically conductive metallization or other conductive material disposed on an upper surface of a flexible dielectric substrate, wherein said coil is comprised of two winding portions, and wherein said winding portions are connected by a linking conductor, and wherein each of said winding portions is comprised of a plurality of concentric loops;
    b) an additional electrically conductive layer or area disposed on a lower surface of said flexible dielectric substrate, such that a capacitance is formed across said flexible dielectric substrate, said capacitance acting in combination with the inductance of said coil to substantially form a transmission line,
    c) electrically conductive connecting means for coupling electrical signals to or from said coil and said additional electrically conductive layer or area to the nuclear magnetic resonance apparatus,
    wherein the substrate is deformed or rolled to form a substantially cylindrical coilform, and wherein the impedance of the RF probe across a frequency range of interest is substantially constant, and
    wherein the probe generates or detects radio frequency electromagnetic radiation transverse to the longitudinal axis of the cylindrical coilform.

8. A method of fabricating and assembling a nuclear magnetic resonance probe assembly for a nuclear magnetic resonance apparatus, the method comprising:
    forming a planar coil of electrically conductive metallization or other conductive material on an upper surface of a flexible dielectric substrate, wherein the coil is comprised of two winding portions connected by a linking conductor, and wherein each winding portion comprises a plurality of concentric loops;

forming an additional electrically conductive layer or area on a lower surface of the flexible dielectric substrate, such that a capacitance is formed across said flexible dielectric substrate, said capacitance acting in combination with the inductance of said coil to substantially form a transmission line;

Rolling or deforming the flexible dielectric substrate to form a substantially cylindrical coilform;

attaching an electrical connection means to the coil and conductive layer or area on the lower surface of the substrate for coupling electrical signals to and from the nuclear magnetic resonance apparatus.

\* \* \* \* \*